(12) United States Patent
Nakatani (10) Patent No.: US 6,446,641 B2
(45) Date of Patent: Sep. 10, 2002

(54) METHOD OF MANUFACTURING SEMICONDUCTOR DEVICE, AND SEMICONDUCTOR DEVICE MANUFACTURED THEREBY

(75) Inventor: Yasuo Nakatani, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/739,229

(22) Filed: Dec. 19, 2000

(30) Foreign Application Priority Data

Jun. 22, 2000  (JP) ........................................ 2000-188383

(51) Int. Cl.⁷ ........................... H01L 21/302; C25F 5/00
(52) U.S. Cl. ..................... 134/1.3; 438/704; 438/719; 438/723; 438/724; 438/725; 438/734; 438/750; 438/753
(58) Field of Search ................... 134/1.3; 438/704, 438/719, 723, 724, 725, 734, 750, 753, 756, 757; 430/5; 216/57, 99, 79

(56) References Cited

U.S. PATENT DOCUMENTS 4,584,055 A * 4/1986 Kayanuma et al. .......... 156/628
5,147,499 A * 9/1992 Szwejkowski et al. ...... 156/643
5,682,062 A * 10/1997 Gaul ........................... 257/687

FOREIGN PATENT DOCUMENTS

JP          4-96329         3/1992

\* cited by examiner

*Primary Examiner*—George Goudreau
(74) *Attorney, Agent, or Firm*—McDermott, Will & Emery (57) ABSTRACT

There is described a method of manufacturing a semiconductor device for accurately and anisotropically etching desired locations on a semiconductor wafer at high selectivity. A polysilicon layer which is to act as a floating gate is embedded in the surface of an oxide film insulating layer. Control gates are formed in a direction orthogonal to the polysilicon layer. Exposed portions of the polysilicon layer are subjected to dry-etching, thereby forming a floating gate. Residues remaining in the channels formed in the oxide film insulating layer are removed by means of wet etching.

6 Claims, 9 Drawing Sheets

Wet(M.E)     Fig. 7A
                 Dry(M.E)

Fig. 7B    Dry(O.E)    Fig. 7C    Wet(O.E)

*Fig. 10B*
Dry

*Fig. 10C*
Wet

METHOD OF MANUFACTURING SEMICONDUCTOR DEVICE, AND SEMICONDUCTOR DEVICE MANUFACTURED THEREBY

BACKGROUND OF THE INVENTION

1. Field of the Invention

The present invention relates to a method of manufacturing a semiconductor device and a semiconductor device manufactured thereby. More particularly, the present invention relates to a method of manufacturing a semiconductor device which is suitable for anisotropically etching a desired location of a semiconductor wafer at high etch selectivity and with high precision, as well as to a semiconductor device manufactured thereby.

2. Description of the Background Art

During the course of manufacture of a semiconductor device, an area surrounded by non-etching regions becomes an object of etching. Accurately etching such an area without involvement of occurrence of residues requires high etch selectivity and high anisotropy. For this reason, in order to etch an area surrounded by non-etching regions, there have conventionally been employed in combination a main etching operation with emphasis on an anisotropic etching operation (dry etching), and an overetching operation with an emphasis on etch selectivity (i.e., dry etching).

In some structures which are to be embodied, an area surrounded by non-etching areas cannot be etched by means of setting only conditions for dry etching. For example, in a case where a structure to be embodied includes a large step difference, it may be impossible to reliably prevent occurrence of residues while ensuring the accuracy of geometry of non-etching regions, no matter how dry etching conditions is adjusted. In such a case, the etching process hinders an improvement in a manufacturing yield.

SUMMARY OF THE INVENTION

The present invention has been conceived to solve such a problem and is aimed at providing a method of manufacturing a semiconductor device which ensures good accuracy of geometry and prevents occurrence of residues even in a case where a structure to be embodied includes a large step.

Further, the present invention provides a semiconductor device manufactured by the method.

The above objects of the present invention are achieved by a method of manufacturing a semiconductor device. The method includes a first etching step. In the first etching step, etching object parts of predetermined material are etched away by means of dry etching while non-etching regions are covered with a mask. The method also includes a second etching step. In the second etching step, residues of the predetermined material remaining in the etching object parts are etched away by means of wet etching.

The above objects of the present invention are also achieved by a semiconductor device manufactured by the method described above.

Other objects and further features of the present invention will be apparent from the following detailed description when read in conjunction with the accompanying drawings.

DESCRIPTION OF THE PREFERRED EMBODIMENTS

Preferred embodiments of the present invention will now be described by reference to the accompanying drawings. Throughout the drawings, like reference numerals designate like elements, and repetition of their explanations is omitted.

First Embodiment

Figure 1:
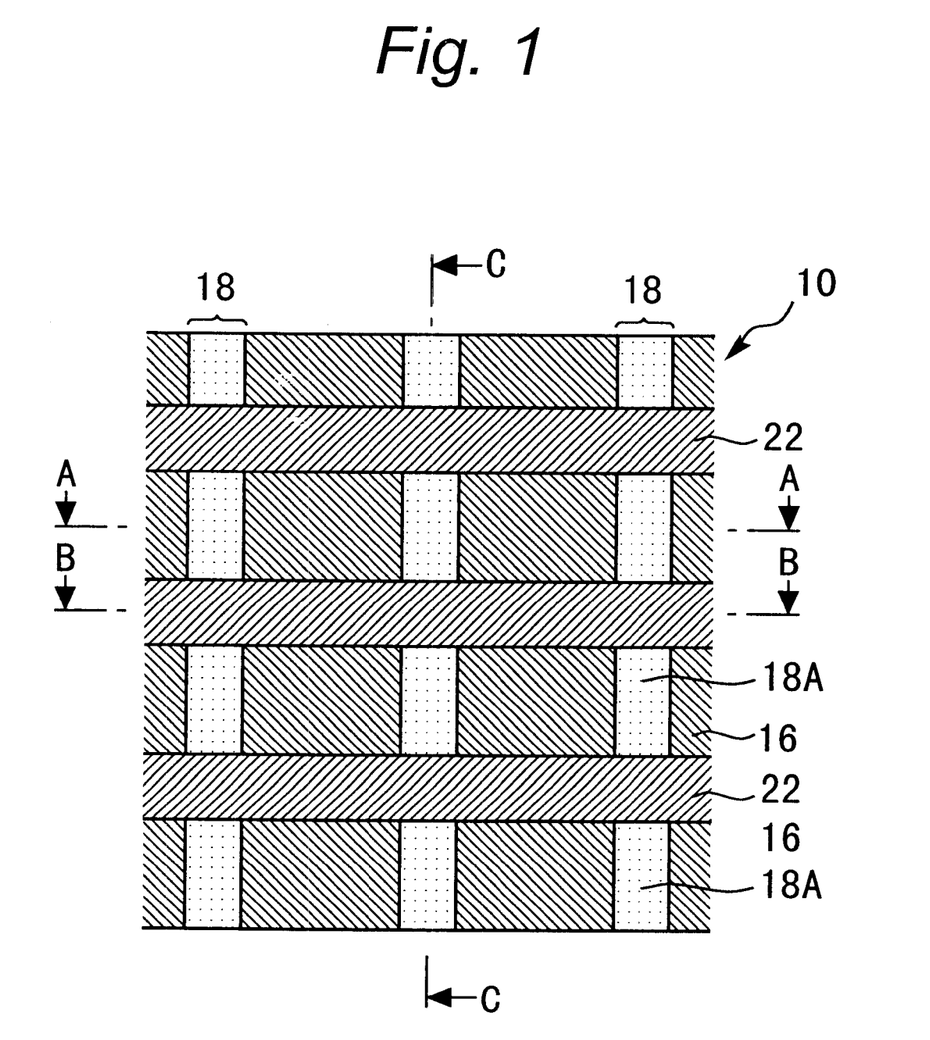
FIG. 1 is a plan view showing a semiconductor wafer processed by a manufacturing method according to a first embodiment of the present invention.
Figure 2A:
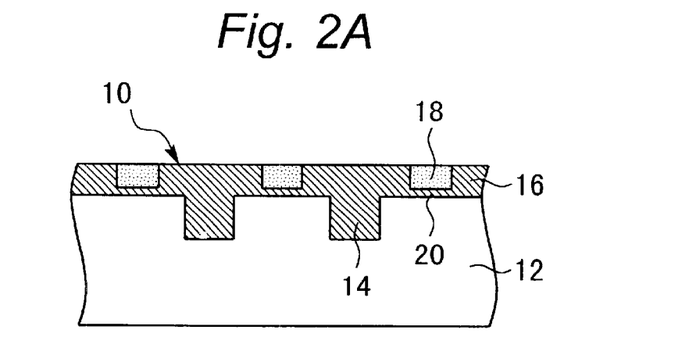
FIG. 2A is a cross sectional view of the semiconductor wafer taken along line A—A shown in FIG. 1.
Figure 2B:
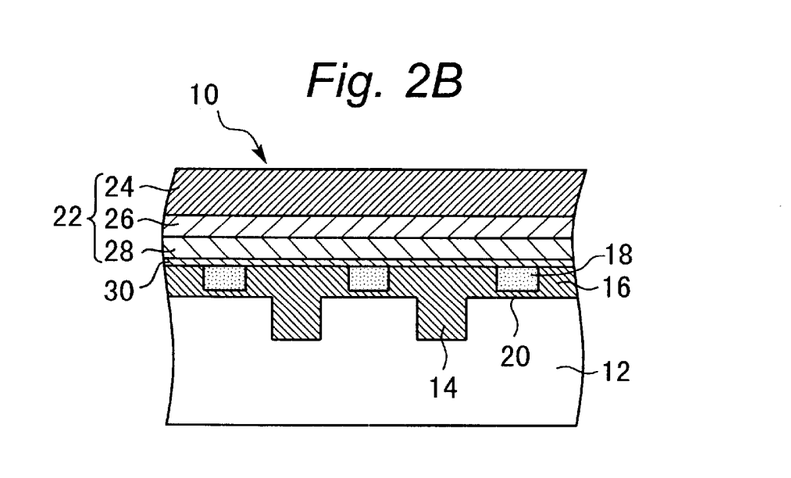
FIG. 2B is a cross-sectional view of the semiconductor wafer taken along line B—B shown in FIG. 1.
Figure 2C:
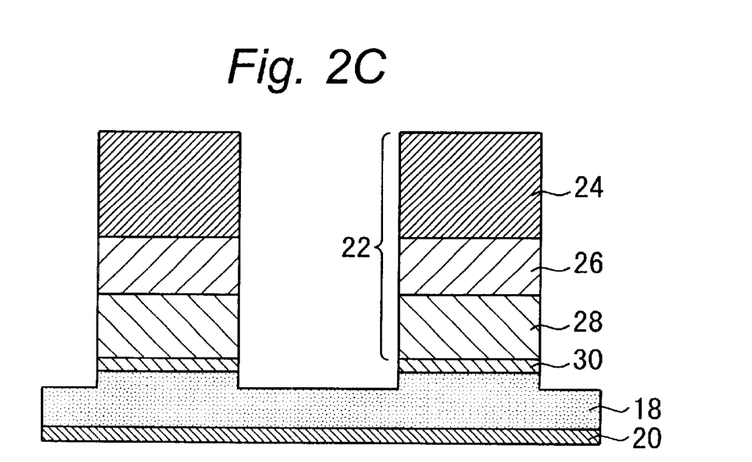
FIG. 2C is a cross-sectional view of the semiconductor wafer taken along line C—C shown in FIG. 1.

FIG. 1 is a plan view showing a semiconductor wafer 10 processed by a manufacturing method according to a first embodiment of the present invention. Further, FIG. 2A is a cross sectional view of the semiconductor wafer 10 taken along line A—A shown in FIG. 1; FIG. 2B is a cross-sectional view of the semiconductor wafer 10 taken along line B—B shown in FIG. 1; and FIG. 2C is a cross-sectional view of the same taken along line C-C shown in FIG. 1. The first embodiment is an example in which the manufacturing method of the present invention is applied to fabrication of flash memory in the semiconductor wafer 10.

As shown in FIGS. 2A and 2B, the semiconductor wafer 10 has a silicon layer 12. Isolation oxide films 14 are formed in the vicinity of the surface of the silicon layer 12 for separating individual active regions from each other. An oxide film insulating layer (TEOS) 16 is formed on the silicon layer 12.

A plurality of polysilicon layers 18 are embedded in the vicinity of the surface of the oxide film insulating layer 16 so as to extend in parallel with each other in a single direction. The polysilicon layer 18 is to later become a floating gate of flash memory (having a thickness of 100 nm and a gate length of 0.35 μm). To this end, an oxide film which has a thickness of 8 nm and acts as a tunnel oxide film 20 is interposed between the polysilicon layer 18 and the silicon layer 12.

As shown in FIG. 1, a control gate 22 is formed on the surface of the semiconductor wafer 10 so as to extend in a direction orthogonal to the polysilicon layer 18. FIG. 2B is a cross-sectional view which is produced when the semiconductor wafer 10 is cut along the control gate 22. FIG. 2C is an enlarged cross-sectional view obtained when the semiconductor wafer 10 is cut along the polysilicon layer 18.

As shown in FIGS. 2B and 2C, the control gate 22 is a multilayered film comprising, in sequence from the top, a TEOS layer 24 of 250 nm thickness, a WSi layer 26 of 100 nm thickness, and a polysilicon layer 28 of 100 nm thickness. The control gate 22 is formed on the oxide film insulating layer 16 and the polysilicon layer 18 by way of a insulating film 30.

In order to fabricate flash memory on the semiconductor wafer 10, the areas of the polysilicon layer 18 which are not covered with the control gates 22 (hereinafter referred to as "object-of-etching areas 18A") are removed by etching, and a floating gate must be formed from polysilicon at positions immediately below the respective control gates 22. At this time, the object-of-etching area 18A is sandwiched between the control gates 22 of large thickness and is embedded in the oxide film insulating layer 16. In order to prevent occurrence of residues while the dimensional and geometrical accuracy of the control gates 22 and the oxide film insulating layer 16 are maintained, it is necessary to etch the object-of-etching areas 18A with high anisotropy and at high etch selectivity.

Figure 3:
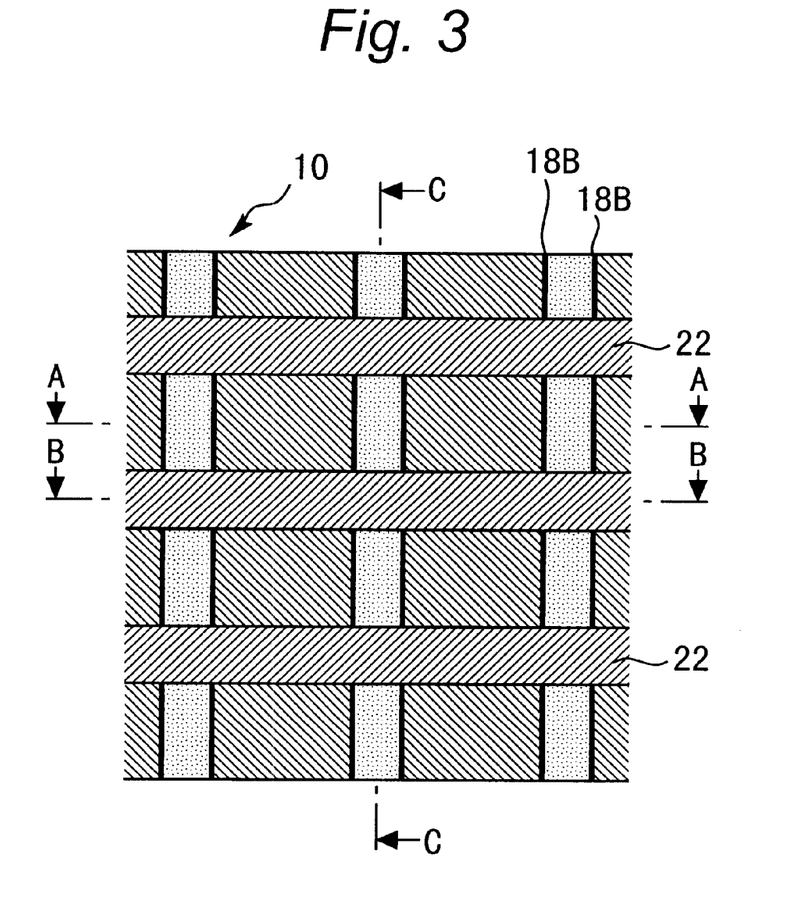
FIG. 3 is a plan view showing the semiconductor device processed by a first-stage etching (dry etching) operation.
Figure 4A:
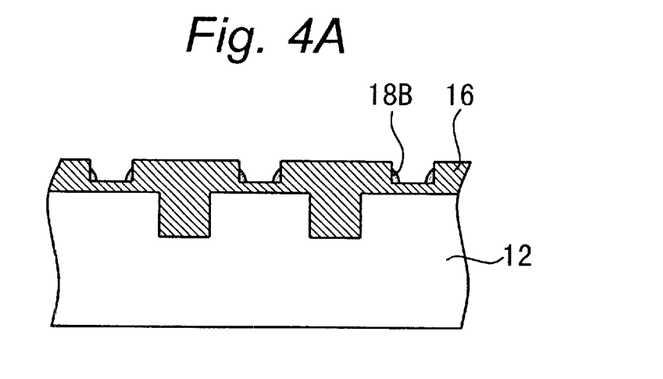
FIG. 4A is a cross sectional view of the semiconductor wafer taken along line A—A shown in FIG. 3.
Figure 4B:
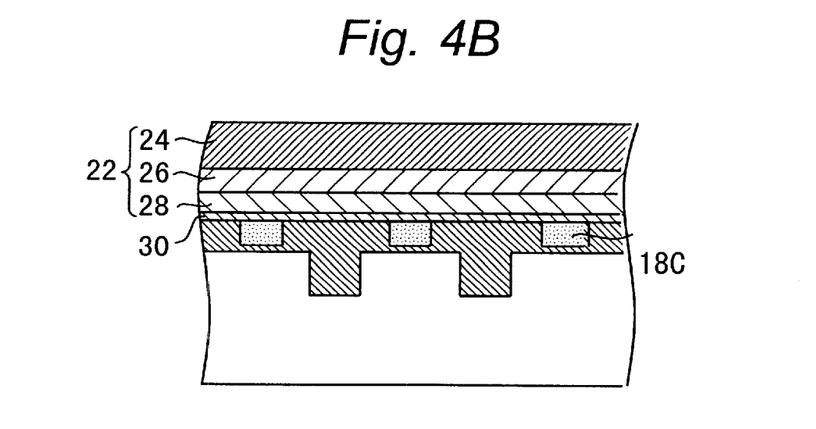
FIG. 4B is a cross-sectional view of the semiconductor wafer taken along line B—B shown in FIG. 3.
Figure 4C:
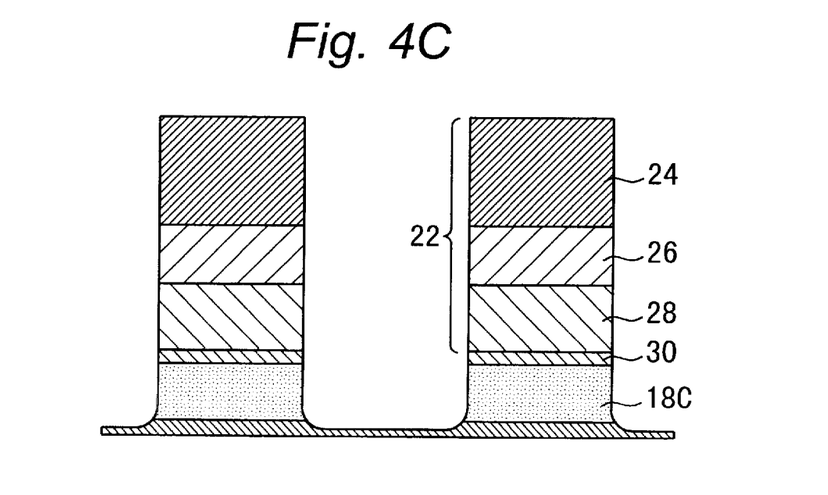
FIG. 4C is a cross-sectional view of the semiconductor wafer taken along line C—C shown in FIG. 3.

FIG. 3 is a plan view of the semiconductor wafer 10 immediately after the wafer 10 has been subjected to an etching operation in a first stage (i.e., a main etching operation) according to the manufacturing method of the present invention. FIG. 4A is a cross-sectional view of the semiconductor wafer 10 taken along line A—A shown in FIG. 3; FIG. 4B is a cross-sectional view of the same taken along line B—B shown in FIG. 3; and FIG. 4C is a cross-sectional view of the same taken along line C—C shown in FIG. 3.

In the first-stage etching operation, the semiconductor wafer 10 is subjected to dry etching featuring high anisotropy. More specifically, the object-of-etching areas 18A are etched by means of ECR discharge using a mixed gas consisting of chlorine and oxygen, on condition that the object-of-etching areas 18A can be removed to a depth corresponding to the thickness of the polysilicon layer 18 (100 nm). At this time, high anisotropy can be achieved by means of setting a dry etching pressure to as low a pressure as about 0.2 Pa. Under this condition, an etch rate of polysilicon to an oxide film assumes a value of 45.

At a point in time when the first-stage etching operation has been completed, as shown in FIGS. 3 and 4A, etch residues 18B of polysilicon remain in channels formed in the oxide film insulating layer 16. Such etch residues 18B cause a short circuit between the control gate 22 and a floating gate 18C (see FIGS. 4B and 4C) formed at a position immediately below the control gate 22. For this reason, the residues 18B must be removed thoroughly.

A conceivable method for removing the residues 18B is to elongate an etching time for removing polysilicon, to thereby sufficiently over-etch the semiconductor wafer 10. However, in a case where the semiconductor wafer 10 is subjected to such over-etching, etching may cause penetration 32 in the thin tunnel oxide film 20, as shown in FIG. 5.

Figure 5:
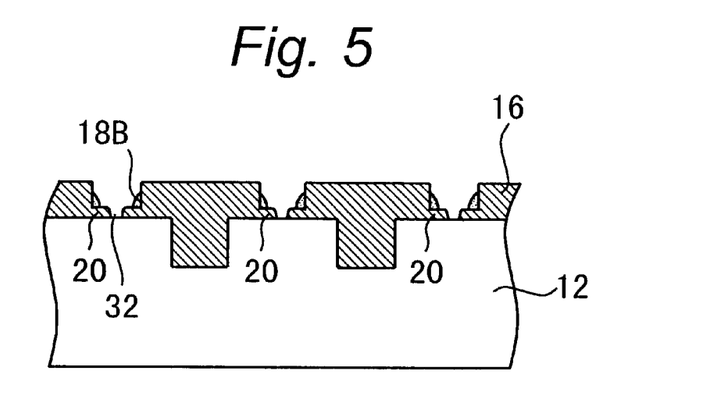
FIG. 5 is a cross-sectional view of the semiconductor wafer for describing a first problem occurring due to an over-etching operation in a dry etching process.

It is be noted that FIG. 5 is a cross-sectional view obtained when the semiconductor wafer 10 is cut along line A—A shown in FIG. 3, as in the case shown in FIG. 4A.

Figure 6:
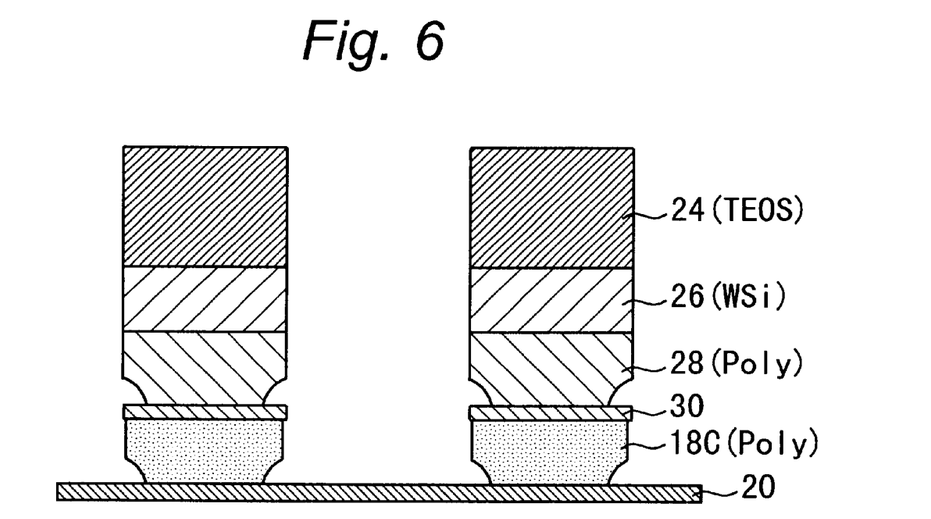
FIG. 6 is a cross-sectional view of the semiconductor wafer for describing a second problem occurring due to an over-etching operation in a dry etching process.

Occurrence of the penetration 32 can be prevented by means of increasing the etch selectivity of polysilicon with respect to an oxide film during an over-etching operation. However, in a case where the etch selectivity of polysilicon is increased, the polysilicon layer 28 of the control gate 22, and a floating gate 18C to be formed below the polysilicon layer 28 are apt to be excessively etched during an over-etching operation. Consequently, the sides of the polysilicon layer 28 and those of the floating gate 18C are etched, as shown in FIG. 6, and hence the profile of the polysilicon layer 28 and that of the floating gate 18C cannot be maintained. It is be noted that FIG. 6 is a cross-sectional view obtained when the semiconductor wafer 10 is cut along line C—C shown in FIG. 3, as in the case shown in FIG. 4C.

As mentioned above, in a case where flash memory is fabricated on the semiconductor wafer 10, it is not necessarily easy to remove the residues 18B by use of an over-etching operation in a dry etching process while preventing occurrence of the penetration 32 in the tunnel oxide film 20 or excessive side-etching of the floating gate 18C.

Here, wet-process etching proceeds through processes differing from those through which dry-process etching proceeds. The difference between the wet-process etching and the dry-process etching will now be described by reference to FIGS. 7A through 7E.

Figure 7A:
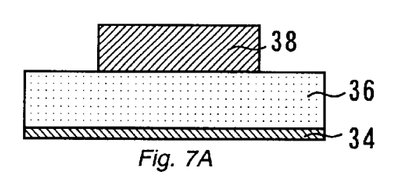
FIGS. 7A through 7E are cross-sectional views of the semiconductor wafer for describing difference between a dry etching process and a wet etching process.

FIG. 7A shows the semiconductor wafer 10, in which a polysilicon layer 36 to be etched is deposited on the oxide film 34 and a mask 38 is patterned on the polysilicon layer 36.

Figure 7B:
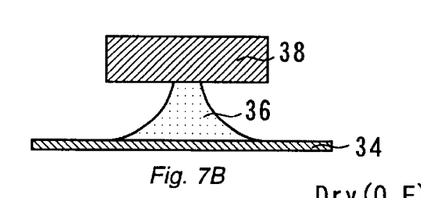
Figure 7C:
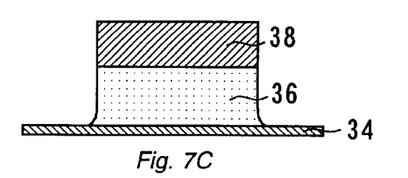

FIG. 7B shows the semiconductor wafer 10, in which the polysilicon layer 36 is subjected to wet-process main etching (M.E.). FIG. 7C shows a wafer in which the polysilicon layer 36 is subjected to dry-process main etching.

As shown in FIG. 7B, in the case of wet-process etching, etching proceeds isotropically, which affects the polysilicon layer 36 laid below the mask 38. Because of such a characteristic of wet-process etching, the wet-process etching is said to be unsuitable for patterning. In contrast, as shown in FIG. 7C, the polysilicon layer 36 which is an object of etching can be etched into substantially the same geometry as that of a mask by means of dry-process etching. For these reasons, dry etching is superior to wet etching in terms of patterning of an object of etching to high accuracy.

Figure 7D:
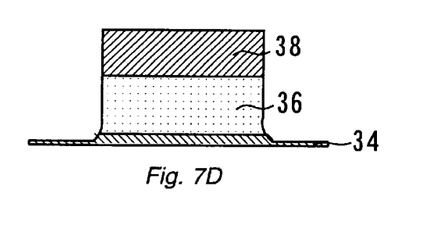

FIG. 7D shows the semiconductor wafer 10, in which the polysilicon layer 36 shown in FIG. 7C has been subjected to over-etching (O.E). More specifically, FIG. 7D shows a wafer which has been subjected to dry etching on condition that an etch selective of polysilicon layer 36 is not very high. In this case, side walls of the polysilicon layer 36 are etched into curves, for reasons of a difference in etch rate in a depthwise direction. In a case where the polysilicon layer 36 is subjected to over-etching through dry processes, penetration of an oxide film or excessive etching of a polysilicon area arises according to whether etch selectivity is high or low, as mentioned previously.

Figure 7E:
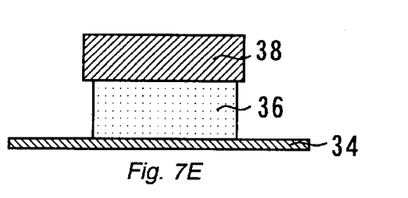

In contrast, in a case where the polysilicon layer 36 is subjected to over-etching by way of wet processes, side walls of the polysilicon layer 36 can be etched at a substantially uniform rate, on the whole, regardless of a position on the side walls in a depthwise direction. In this case, etching proceeds isotropically, and hence the side walls of the polysilicon layer 36 can be over-etched without inflicting much damage on the oxide film 34. Therefore, so long as the structure shown in FIG. 7C is processed through wet-process etching, the polysilicon layer 36 can be over-etched while being accurately maintained in a desired geometry without much damage being inflicted on the oxide film 34, as shown in FIG. 7E.

Against such a backdrop, in the present embodiment the first-stage etching operation is followed by a second-stage etching operation (i.e., an over-etching operation) through wet processes.

Figure 8:
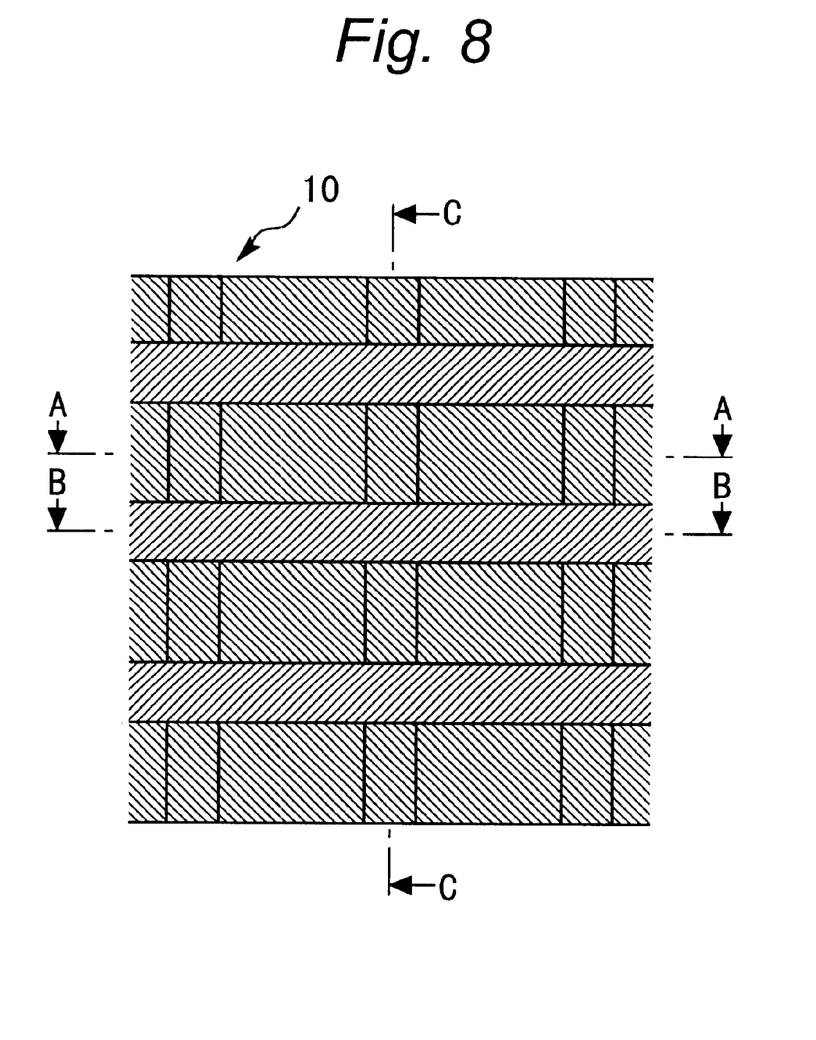
FIG. 8 is a plan view showing the semiconductor device processed by a second-stage etching (wet etching) operation.
Figure 9A:
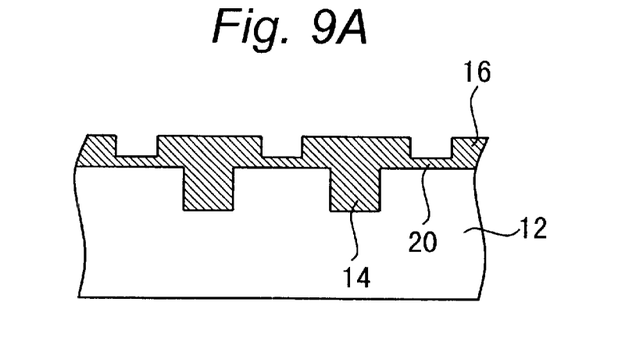
FIG. 9A is a cross sectional view of the semiconductor wafer taken along line A—A shown in FIG. 8.
Figure 9B:
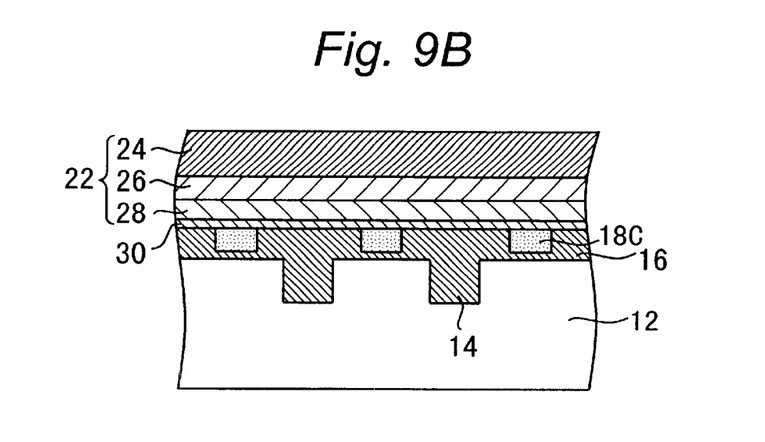
FIG. 9B is a cross-sectional view of the semiconductor wafer taken along line B—B shown in FIG. 8.
Figure 9C:
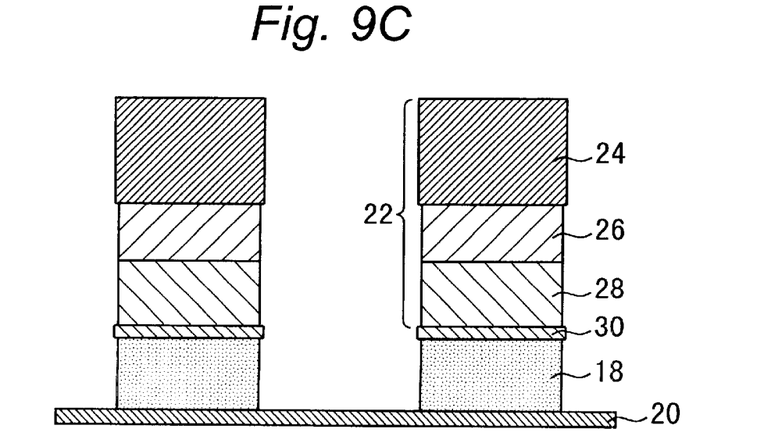
FIG. 9C is a cross-sectional view of the semiconductor wafer taken along line C—C shown in FIG. 8.

FIG. 8 is a plan view showing the semiconductor wafer 10 immediately after having been over-etched through the second-stage etching; that is, wet processes, according to the manufacturing method of the present invention. FIG. 9A is a cross-sectional view taken when the semiconductor wafer 10 is cut along line A—A shown in FIG. 8; FIG. 9B is a cross-sectional view taken when the semiconductor wafer 10 is cut along line B—B shown in FIG. 8; and FIG. 9C is a cross-sectional view taken when the semiconductor wafer 10 is cut along line C—C shown in FIG. 8.

The second-stage etching operation is performed while a mixed fluid consisting of ammonium hydroxide, hydrogen peroxide, and purified water is used as an etchant. The etchant has an etch rate of 5.7 nm/min with respect to polysilicon and an etch rate of 0.14 nm/min with respect to $SiO_2$ (i.e., the oxide film insulating layer 16 and the tunnel oxide film 20). Accordingly, the ratio of the etch rate of polysilicon to the etch rate of $SiO_2$ is about 40.

In the present embodiment, the second-stage etching operation is performed on condition that polysilicon can be removed to a depth of only 20 nm; that is, is performed for a time period of 210 sec. As shown in FIGS. 8 and 9, the polysilicon residues 18B can be completely removed without inducing occurrence of penetration in the tunnel oxide film 20 and while the accuracy of geometry of the oxide film insulating layer 16, that of the control gates 22, and that of the floating gates 18C are ensured. As mentioned above, the manufacturing method according to the present embodiment enables appropriate etching of the object-of-etching 18A which is embedded in the oxide film insulating layer 16 and is sandwiched between the control gates 22, without involvement of occurrence of residues and without deteriorating the accuracy of geometry of non-etching areas.

Second Embodiment

A second embodiment of the present invention will now be described by reference to FIGS. 10A through 10C. In the first embodiment, the structure of an object of processing is limited to a special structure; that is, a structure in which an object of etching is surrounded by non-etching areas. However, an object of processing to which a manufacturing method according to the present invention can be effectively applied is not limited to an object of such a special structure.

In a case where a gate electrode is formed in an active region of a semiconductor wafer, polysilicon is deposited over the entire surface of the semiconductor wafer. The thus-deposited polysilicon is patterned into a desired geometry by means of etching. In this case, in order to stabilize the quality of a semiconductor device, there is a demand for preventing occurrence of etch residues without involvement of an excessive etching operation.

In association with a recent increase in miniaturization of a semiconductor device, a step arising in a boundary area between an active region and an isolation oxide film tends to become steeper, and a gate oxide film provided in an active region tends to become thinner. In processes for manufacturing such a semiconductor device, when the polysilicon deposited on the semiconductor wafer is patterned by means of etching, etch residues are apt to arise in a boundary area between an isolation oxide film and an active region, and penetration or the like is likely to arise in a gate oxide film.

Figure 10A:
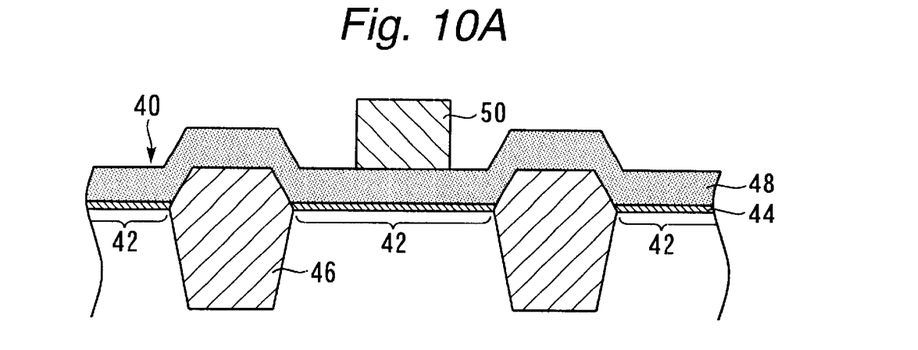
FIGS. 10A through 10C are cross-sectional views of a semiconductor wafer for describing a manufacturing method according to a second embodiment of the present invention.
Figure 10B:
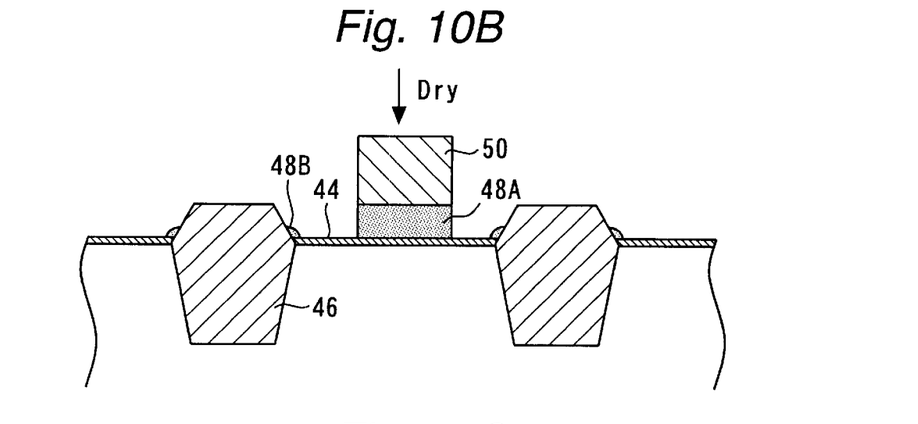
Figure 10C:
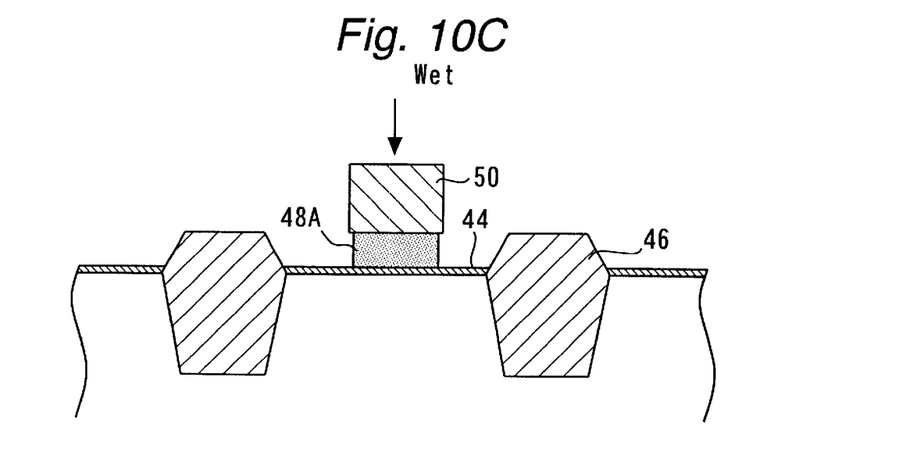

FIGS. 10A through 10C are illustrations for describing the manufacturing method for patterning a semiconductor wafer having the above-described characteristic.

According to the second embodiment, as shown in FIG. 10A, an active region 42 of a semiconductor wafer 40 which is an object of processing is coated with a gate oxide film 44 having a thickness of 7 nm. The semiconductor wafer 40 further has an isolation oxide film 46 which constitutes a steep step in a boundary area between the active region 42 and the isolation oxide film 46. The isolation oxide film 46 protrudes 100 nm at an angle of 80° above the gate oxide film 44. A polysilicon layer 48 which is an object of etching is deposited to a thickness of 100 nm on the isolation oxide film 46 and the polysilicon layer 48. A silicon nitride film 50 which is to become an etching mask is formed on the polysilicon layer 48 and is patterned into a predetermined geometry to a thickness of 200 nm.

According to the manufacturing method of the present invention, the semiconductor wafer 40 is subjected to a first-stage etching operation; that is, a main etching operation through dry processes. As in the case of the first embodiment, the semiconductor wafer 40 is subjected to the first-stage etching operation by means of ECR discharge using a mixed gas consisting of chlorine and oxygen, on condition that the polysilicon layer 48 (100 nm) can be removed. At this time, dry etching is effected at a pressure as low as 0.2 Pa or thereabouts, thereby achieving high anisotropy. Under this condition, the ratio of the etch rate of polysilicon to the etch rate of an oxide film assumes a value of 45.

As shown in FIG. 10B, after completion of a first-stage etching operation, a gate electrode 48A is formed from polysilicon below the silicon nitride film 50. At this time, polysilicon etch residues 48B are formed in a boundary area between the isolation oxide film 46 and the active region 42.

According to the manufacturing method of the present embodiment, a second-stage etching operation; that is, an over-etching operation, is performed through wet processes. As in the case of the first embodiment, the second-stage etching operation is performed while a mixed fluid consisting of ammonium hydroxide, hydrogen peroxide, and purified water is used as an etchant, on condition that polysilicon can be removed to a depth of only 20 nm; that is, the second-stage etching operation is performed for a time period of 210 sec. As shown in FIG. 10C, by means of the second-stage etching operation, the polysilicon residues 48B can be completely removed without inducing occurrence of penetration in the gate oxide film 44 and while the accuracy of geometry of the gate oxide film 48A is ensured. According to the manufacturing method of the present embodiment, the gate electrode 48A can be formed with high accuracy in the area surrounded by isolation oxide films 46 which protrude far from the respective active regions 42, without involvement of occurrence of defects in the gate oxide film 44.

In the first embodiment, the semiconductor wafer 10 is dry-etched while the oxide film insulating layer 16 and the TEOS layer 24; that is, silicon oxide films laid on the semiconductor wafer 10, are taken as masks. Then, while the silicon oxide films are taken as masks, the semiconductor wafer 10 is subjected to a second-stage etching operation; that is, wet etching. In the second embodiment, the semiconductor wafer is etched while the silicon nitride film 50 is taken as a mask. Further, the semiconductor wafer is subjected to wet etching while the silicon nitride film 50 is utilized as a mask.

As described above, in a case where an oxide film or a nitride film acts as a mask for the first-stage etching operation (i.e., a dry etching operation), those films can be utilized as it is as a mask to perform the second-stage etching operation of the semiconductor wafer. In this respect, effecting a first-stage etching operation while an oxide film or a nitride film is taken as a mask is efficient. However, material which can be used as a mask during the first-stage etching operation is not limited to an oxide film or a nitride film. The first-stage etching operation may be effected while photoresist is used as a mask. In this case, so long as a semiconductor wafer is subjected to a second-stage etching operation after removal of photoresist, there can be yielded the same advantage as that yielded in the first or second embodiment.

Since the present invention has been embodied in the manner as mentioned above, the invention yields the following advantages.

According to a first aspect of the present invention, residues of predetermined material which could not have been removed by dry etching can be thoroughly removed by means of wet etching. In this case, a dry etching operation can be performed on condition that occurrence of residues is allowed. Therefore, excessive etching of a lower film can be prevented. Thus, according to the present invention, an object of etching can be appropriately etched without involvement of excessive etching, deteriorating geometrical accuracy, or inducing residues.

According to a second aspect of the present invention, polysilicon remaining in an area to be etched can be removed thoroughly.

According to a third aspect of the present invention, a semiconductor wafer is subjected to wet etching through use of a mixed fluid consisting of ammonium hydroxide, hydrogen peroxide, and purified water as an etchant. As a result, polysilicon residues, which would arise after dry etching, can be removed thoroughly.

According to a fourth aspect of the present invention, at the time of a wet etching operation, predetermined material can be removed at high etch selectivity. Therefore, residues can be removed without inflicting damage to a substrate located below an area to be etched.

According to a fifth aspect of the present invention, a silicon oxide film which acts as a mask during a dry etching operation can be utilized, in its present form, as a mask even during a wet etching operation.

According to a sixth aspect of the present invention, a silicon nitride film which acts as a mask during a dry etching operation can be utilized, in its present form, as a mask even during a wet etching operation.

According to a seventh aspect of the present invention, after a semiconductor wafer has been subjected to dry etching while photoresist is used as a mask, the photoresist is removed so that the wafer can be subjected to wet etching. In this case, non-etching areas can be prevented from being damaged during the course of a dry etching operation.

According to a eighth aspect of the present invention, there can be manufactured a semiconductor device having a superior dimensional accuracy, stable quality, and high reliability.

Further, the present invention is not limited to these embodiments, but variations and modifications may be made without departing from the scope of the present invention.

The entire disclosure of Japanese Patent Application No. 2000-188383 filed on Jun. 22, 2000 including specification, claims, drawings and summary are incorporated herein by reference in its entirety.

What is claimed is:

1. A method of manufacturing a semiconductor device comprising:

forming a polysilicon layer on an insulating layer;

forming a mask over the polysilicon layer;

dry etching to remove parts of the polysilicon layer without removing regions under the mask leaving polysilicon etching residues; and wet etching to remove residues of the polysilicon residues, wherein the mask used in the first etching steps is formed from a silicon oxide film or a silicon nitride film, and the mask is used as a mask during wet etching.

2. The method according to claim 1, comprising etching the polysilicon layer to form a gate electrode.

3. The method according to claim 2, comprising wet etching with a mixed fluid including ammonium hydroxide, hydrogen peroxide, and purified water.

4. The method according to claim 1, comprising wet etching such that the etch rate of polysilicon to the underlying insulating layer is 35 or more.

5. The method according to claim 2, wherein the mask used in the first etching step is formed from a silicon oxide film.

6. The method according to claim 2, wherein the mask used in the first etching step is formed a silicon nitride film.

* * * * *